(12) United States Patent
Nakano et al.

(10) Patent No.: US 12,354,826 B2
(45) Date of Patent: Jul. 8, 2025

(54) CHARGED PARTICLE BEAM APPARATUS

(71) Applicant: HITACHI HIGH-TECH CORPORATION, Tokyo (JP)

(72) Inventors: Tomonori Nakano, Tokyo (JP); Yu Yamazawa, Tokyo (JP); Hideo Kashima, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 939 days.

(21) Appl. No.: 17/603,255

(22) PCT Filed: Apr. 19, 2019

(86) PCT No.: PCT/JP2019/016888
§ 371 (c)(1),
(2) Date: Oct. 12, 2021

(87) PCT Pub. No.: WO2020/213171
PCT Pub. Date: Oct. 22, 2020

(65) Prior Publication Data
US 2022/0199356 A1   Jun. 23, 2022

(51) Int. Cl.
*H01J 37/153* (2006.01)
*H01J 37/06* (2006.01)
(Continued)

(52) U.S. Cl.
CPC ............ *H01J 37/153* (2013.01); *H01J 37/06* (2013.01); *H01J 37/09* (2013.01); *H01J 37/141* (2013.01);
(Continued)

(58) Field of Classification Search
CPC .......... H01J 37/06; H01J 37/09; H01J 37/141; H01J 37/153; H01J 37/28
See application file for complete search history.

(56) References Cited

U.S. PATENT DOCUMENTS

2009/0032722 A1   2/2009 Ito et al.
2009/0079531 A1   3/2009 Zach et al.
(Continued)

FOREIGN PATENT DOCUMENTS

JP   2009-054581 A   3/2009
JP   2009-081138 A   4/2009
(Continued)

OTHER PUBLICATIONS

International Search Report, PCT/JP2019/016888, Jul. 9, 2019 (2 pages).

*Primary Examiner* — David E Smith
(74) *Attorney, Agent, or Firm* — Volpe Koenig

(57) ABSTRACT

A charged particle beam apparatus including a winding aberration corrector capable of correcting a chromatic aberration is provided. A multi-pole lens includes a magnetic core 150, a plurality of current lines 101 to 112, a plurality of wire-shaped electrodes 301 to 312, insulating electrode fixing portions 313 to 342 for fixing the plurality of electrodes to a structure in a vacuum container, and conductive shields 320, 321 set to a reference potential, which are provided between the electrode fixing portion and a central axis of the magnetic core, main line portions of the plurality of current lines are arranged axisymmetrically with respect to the central axis of the magnetic core along an inner wall of the magnetic core, and portions of the plurality of electrodes parallel to the central axis of the magnetic core are arranged axisymmetrically with respect to the central axis of the magnetic core.

8 Claims, 9 Drawing Sheets

(51) Int. Cl.
*H01J 37/09* (2006.01)
*H01J 37/141* (2006.01)
*H01J 37/28* (2006.01)

(52) U.S. Cl.
CPC ....... *H01J 37/28* (2013.01); *H01J 2237/1534* (2013.01)

(56) References Cited

U.S. PATENT DOCUMENTS

| | | |
|---|---|---|
| 2013/0264477 A1 | 10/2013 | Martin |
| 2016/0217967 A1 | 7/2016 | Dohi et al. |
| 2016/0225576 A1 | 8/2016 | Kohno |
| 2018/0190469 A1 | 7/2018 | Cheng et al. |
| 2020/0152414 A1* | 5/2020 | Nakano ................ H01J 37/153 |
| 2020/0373117 A1 | 11/2020 | Nakano |

FOREIGN PATENT DOCUMENTS

| | | |
|---|---|---|
| JP | 2016-134295 A | 7/2016 |
| JP | 2016-139456 A | 8/2016 |
| WO | 2019/043759 A1 | 3/2019 |

\* cited by examiner

[FIG. 1A]
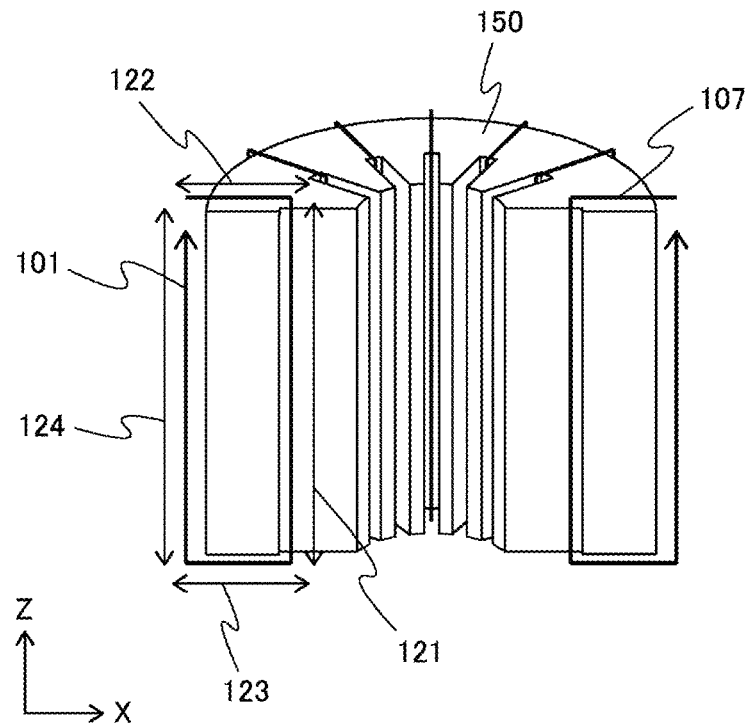
[FIG. 1B]
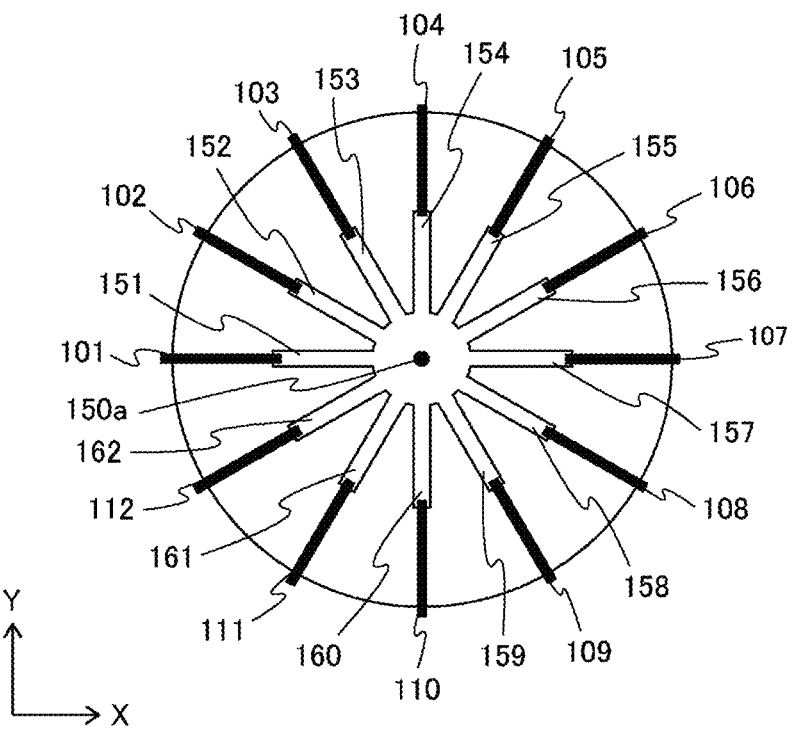

[FIG. 1C]
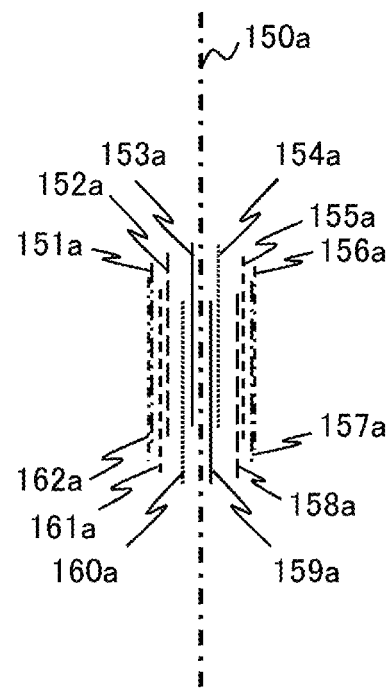
[FIG. 2]
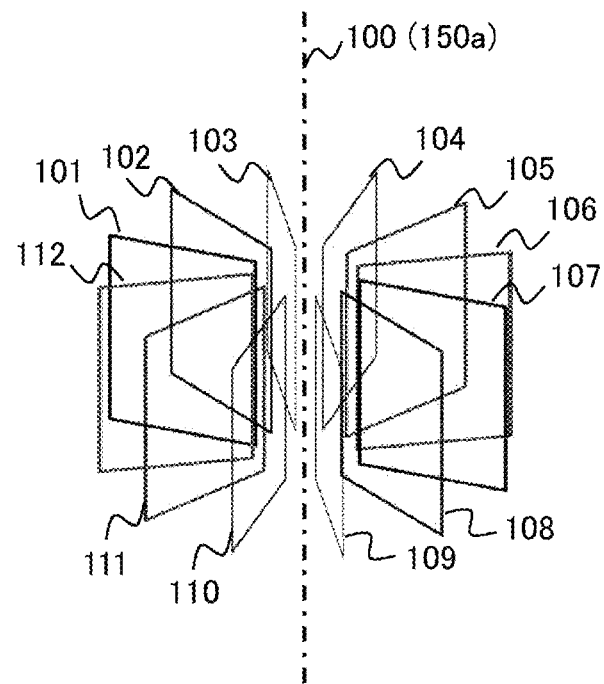

[FIG. 3]
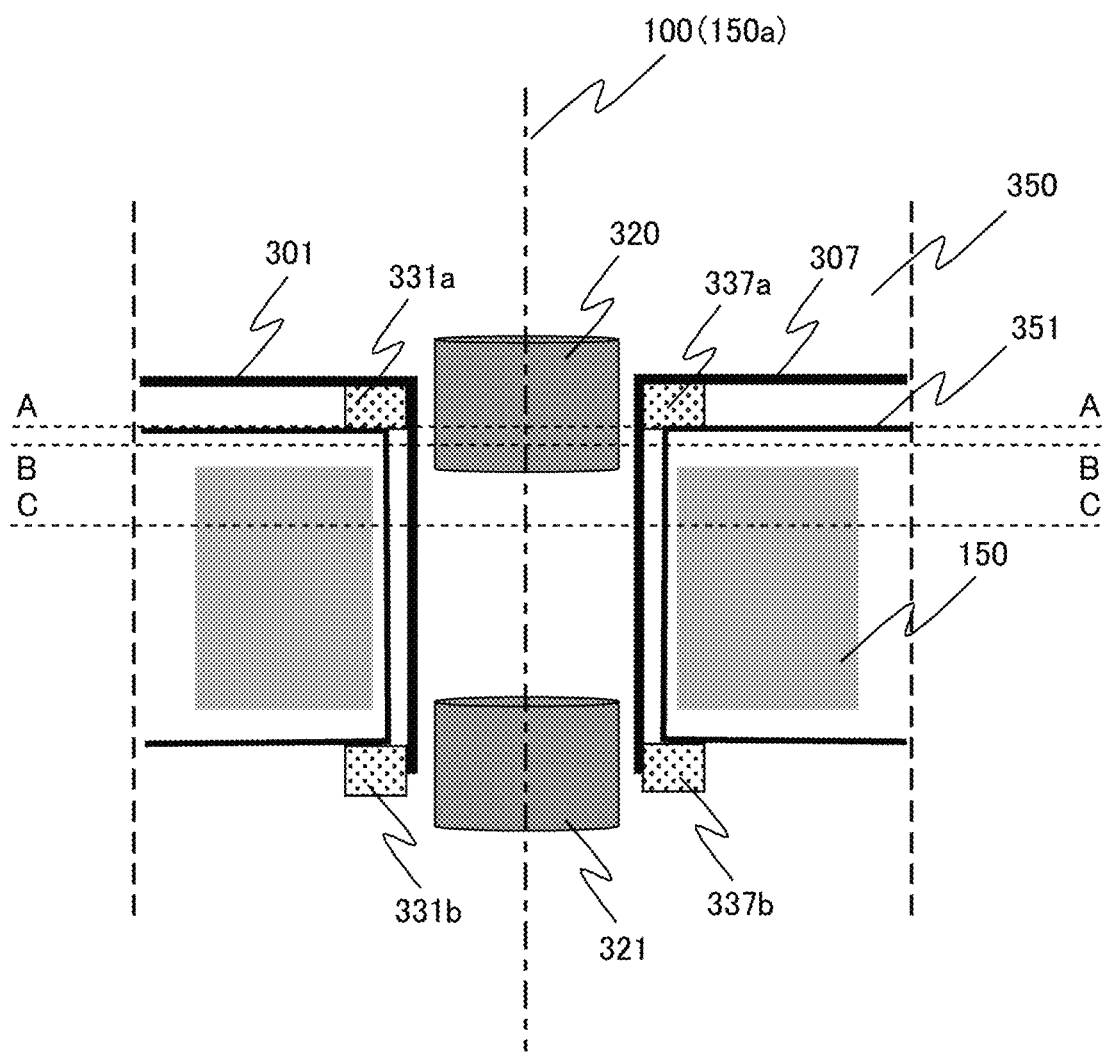

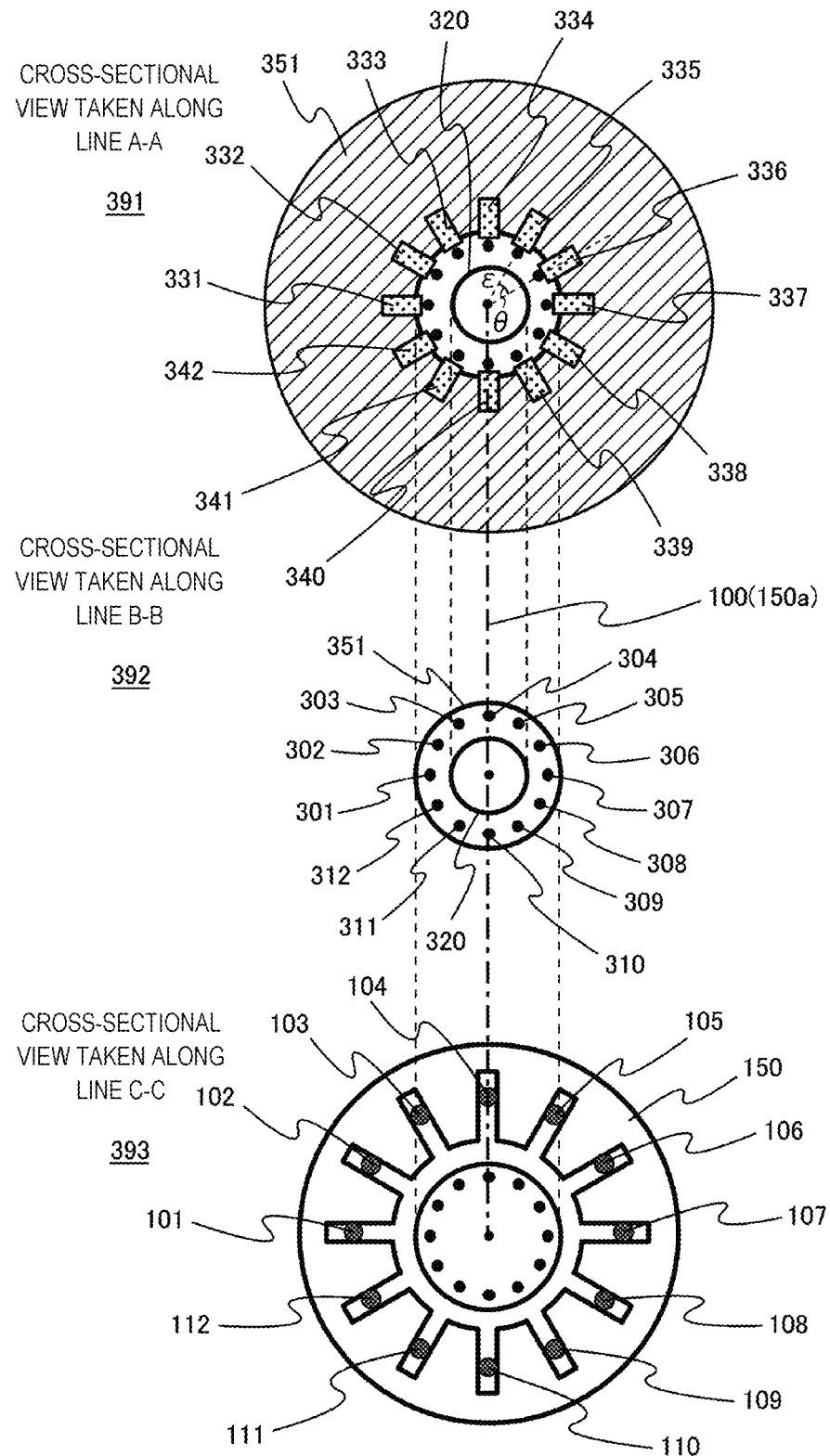

[FIG. 5]
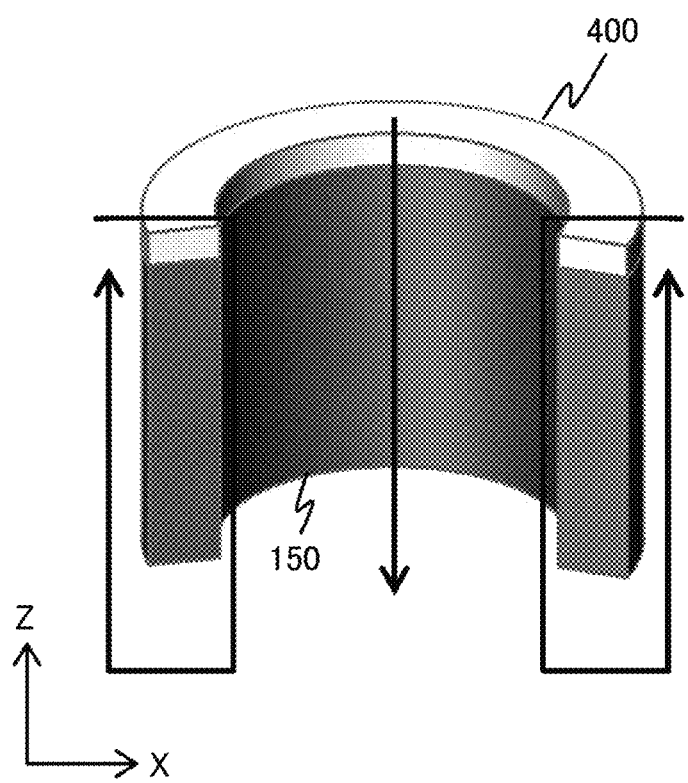

[FIG. 6]
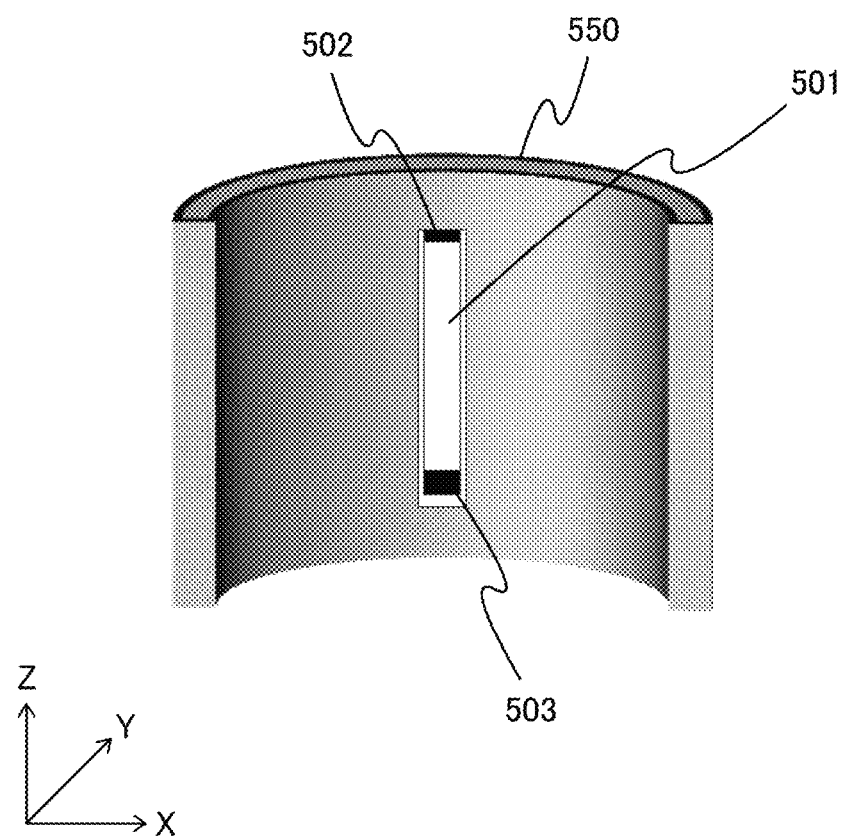

[FIG. 7]
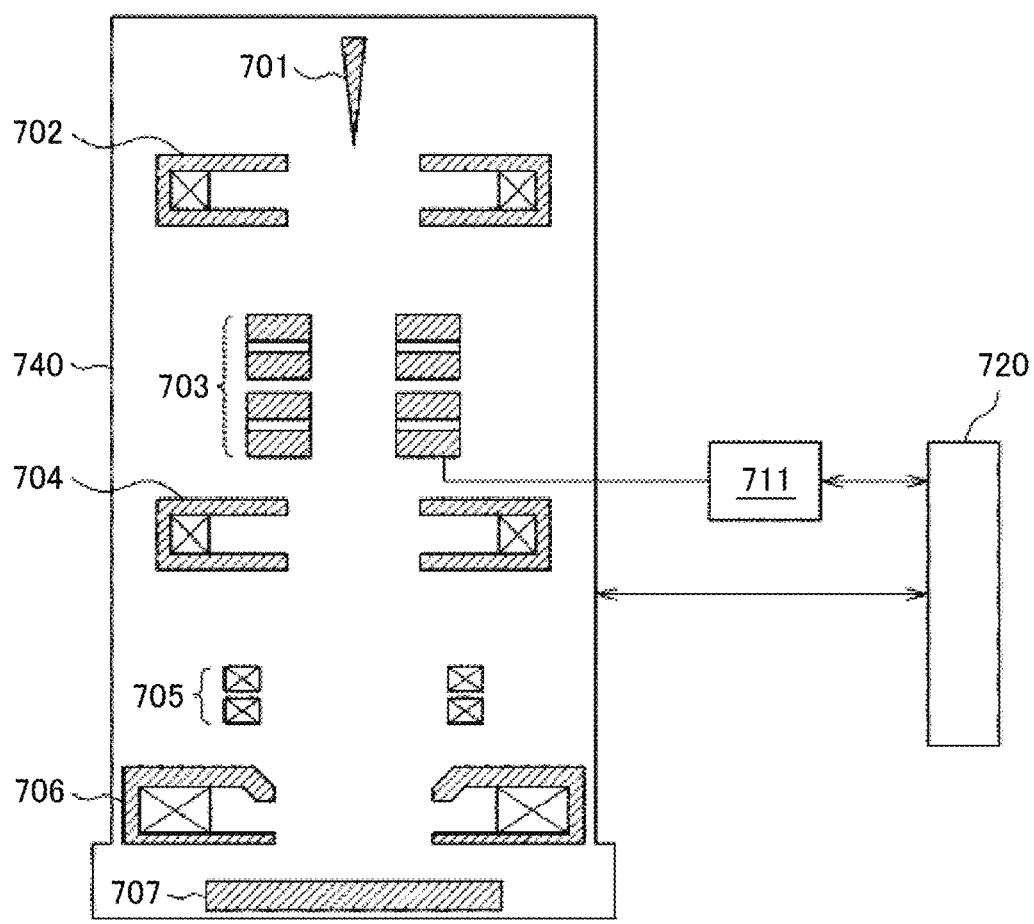

[FIG. 8A]
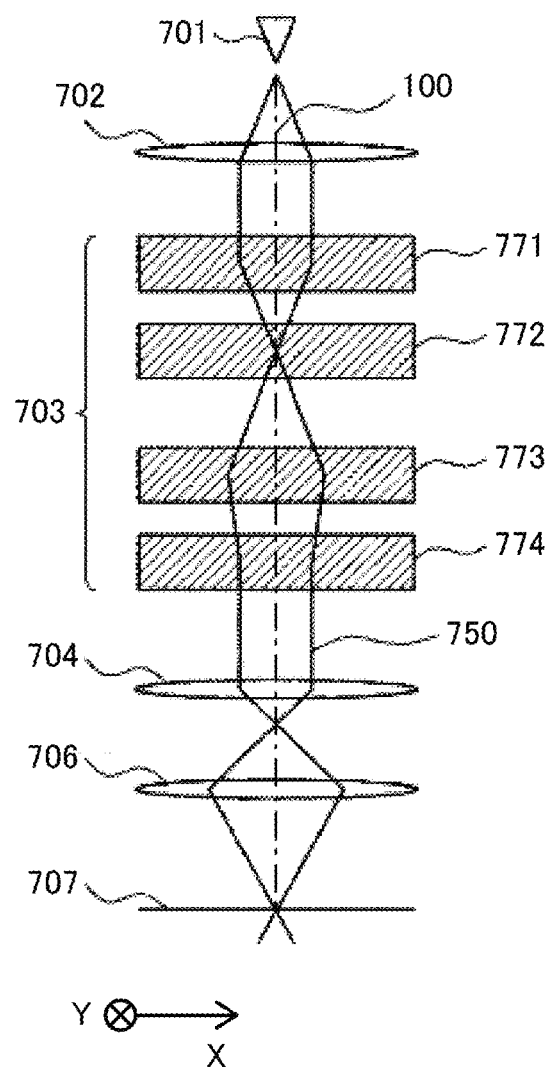

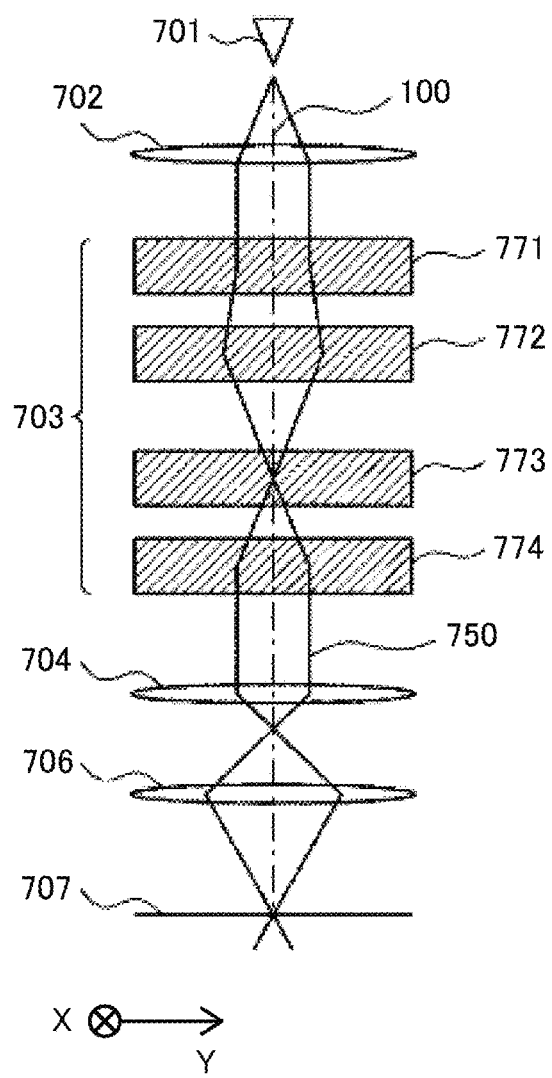
[FIG. 8B]

CHARGED PARTICLE BEAM APPARATUS

TECHNICAL FIELD

The present invention relates to a charged particle beam application technique, and particularly to a charged particle beam apparatus such as a scanning electron microscope and a transmission electron microscope equipped with an aberration corrector.

BACKGROUND ART

In a charged particle beam apparatus such as a scanning electron microscope (SEM) or a scanning transmission electron microscope (STEM), an aberration corrector is introduced in order to improve resolution. One of the types of aberration correctors includes multi-pole lenses arranged in a plurality of stages. As the multi-pole lens in which a plurality of multi-pole fields are combined by generating an electric field or a magnetic field, there is a lens that removes aberrations contained in a charged particle beam passing through the inside. PTL 1 discloses a winding type aberration corrector that generates multi-pole fields using a magnetic field obtained from a plurality of current lines.

CITATION LIST

Patent Literature

PTL 1: JP-A-2009-54581

SUMMARY OF INVENTION

Technical Problem

In PTL 1, the aberration corrector of a relatively inexpensive multi-pole correction system can be achieved by forming the multi-pole fields by using the current lines, but high mechanical positional accuracy, in this case, high positional accuracy is required for arranging the current lines.

A demand for the high positional accuracy is relaxed by providing the multi-pole lens with a magnetic core, providing an inner wall of the magnetic core with a plurality of grooves for arranging main line portions of the current lines, and arranging the plurality of grooves to be formed such that centers of the plurality of grooves are arranged axisymmetrically with respect to a central axis of the magnetic core. According to this configuration, when a center position of the groove of the magnetic core is manufactured with high accuracy in a circumferential direction and a radial direction, a deviation of an arrangement position of the current line in the groove can almost eliminate an influence on a magnetic field strength generated by the multi-pole lens.

Although there is a chromatic aberration as one of aberrations of an electron lens used in an electron microscope, it is necessary to excite the electric field in addition to the magnetic field in order to correct the chromatic aberration in order to increase the resolution of the electron microscope. Therefore, in the aberration corrector (referred to as a "winding aberration corrector") using the multi-pole lens using the current lines, it is necessary to excite the electric field, and it is necessary to arrange an electrode for exciting the electric field in the multi-pole lens.

Solution to Problem

A charged particle beam apparatus according to an embodiment includes: an electron gun that emits a primary electron beam; an aberration corrector that includes a plurality of stages of multi-pole lenses to which the primary electron beam is incident; an objective lens to which the primary electron beam passing through the aberration corrector is incident; and a vacuum container that accommodates the electron gun, the aberration corrector, and the objective lens, in which the multi-pole lens includes a magnetic core, a plurality of current lines, a plurality of wire-shaped electrodes, an insulating electrode fixing portion for fixing the plurality of electrodes to a structure in the vacuum container, and a conductive shield set to a reference potential, which is provided between the electrode fixing portion and a central axis of the magnetic core, main line portions of the plurality of current lines are arranged axisymmetrically with respect to the central axis of the magnetic core along an inner wall of the magnetic core, and portions of the plurality of electrodes parallel to the central axis of the magnetic core are arranged axisymmetrically with respect to the central axis of the magnetic core.

Advantageous Effect

It is possible to provide a charged particle beam apparatus including a winding aberration corrector capable of correcting a chromatic aberration.

Other technical problems and novel characteristics will be apparent from a description of the description and the accompanying drawings.

BRIEF DESCRIPTION OF DRAWINGS

FIG. 1A is an aerial cross-sectional view (schematic view) of a multi-pole lens.

FIG. 1B is a top view (schematic view) of the multi-pole lens.

FIG. 1C is an aerial view (schematic view) of a center position of a groove provided in a magnetic core.

FIG. 2 is an aerial view (schematic view) of current lines.

FIG. 3 is a diagram showing a configuration of a multi-pole lens capable of superimposing an electric field.

FIG. 4 shows diagrams of a configuration of the multi-pole lens capable of superimposing the electric field.

FIG. 5 is an example of the multi-pole lens in which a non-magnetic spacer is provided in the magnetic core.

FIG. 6 is an aerial cross-sectional view of the magnetic core.

FIG. 7 is a configuration example of an electron beam apparatus.

FIG. 8A is an electron optical schematic diagram showing a trajectory of an electron beam passing through a winding aberration corrector.

FIG. 8B is an electron optical schematic diagram showing a trajectory of the electron beam passing through the winding aberration corrector.

DESCRIPTION OF EMBODIMENTS

A winding aberration corrector includes a plurality of stages of multi-pole lenses. The multi-pole lens of the present embodiment has a configuration in which current lines generating a magnetic field are arranged in grooves provided in an inner wall of a magnetic core. With reference to FIGS. 1A to 1C, an arrangement of the magnetic core and the current lines generating the magnetic field in the multi-pole lens according to the present embodiment will be described. FIG. 1A is an aerial cross-sectional view (schematic view) of a one-stage multi-pole lens of the winding aberration corrector. FIG. 1B is a top view (schematic view) of the one-stage multi-pole lens of the winding aberration corrector. FIG. 1C is an aerial view (schematic view) of a center position of a groove provided in the magnetic core. A magnetic core 150 is made of a magnetic material such as pure iron or permalloy, has a cylindrical shape, and has grooves 151 to 162 each extending in a Z direction on the inner wall thereof. As shown in FIG. 1C, center positions 151a to 162a of the grooves are provided axisymmetrically with respect to a central axis 150a of the magnetic core 150. That is, the center position 151a of the groove 151 and the center position 157a of the groove 157 are arranged on the same plane so as to be axisymmetrical with respect to the central axis 150a. The same applies to the center position 152a of the groove and the center position 158a of the groove, the center position 153a of the groove and the center position 159a of the groove, the center position 154a of the groove and the center position 160a of the groove, the center position 155a of the groove and the center position 161a of the groove, and the center position 156a of the groove and the center position 162a of the groove. Although twelve grooves are provided in this example, the number of the grooves is not limited. An angle between adjacent grooves is an angle (360°/k) obtained by dividing the central axis 150a of the magnetic core 150, as a rotation axis, by the number k of the grooves, where the number of the grooves is k.

Main line portions of current lines 101 to 112 are arranged in the grooves 151 to 162 provided in the magnetic core 150, respectively. FIG. 2 is an aerial view (schematic view) obtained by extracting only the current lines 101 to 112. The twelve current lines including the current lines 101 to 112 are arranged around an optical axis 100 of a charged particle beam. The optical axis 100 of the charged particle beam coincides with the central axis 150a of the magnetic core 150.

A structure of the current line will be described by taking the current line 101 shown in FIG. 1A as an example. The current line 101 has a rectangular circuit shape, and a current is supplied from a power supply (not shown). An arrow attached to the current line is a direction along which the current flows. Hereinafter, as shown in FIG. 1A, the current line is divided into four sections corresponding to sides of a rectangular shape, and each of the sections is referred to as a main line portion 121, a connection portion 122, a connection portion 123, and a return line portion 124. The main line portion 121 is a portion of the current line that is arranged in the groove of the magnetic core, the connection portions 122 and 123 are portions where the main line portion 121 is introduced into the groove from the outside of the magnetic core, or where the main line portion 121 is led out from the groove to the outside of the magnetic core, and the return line portion 124 is a portion of the current line that is arranged outside the magnetic core.

A multi-pole field is formed by the magnetic field from the main line portion. Although the power supply is omitted for a winding lens (multi-pole lens) shown in FIG. 2, it is necessary to flow the current in a specific distribution in order to excite the multi-pole field. For example, as a combination for exciting a 2N pole field (N is an integer of 1 or more), when currents applied to the current lines 101 to 112 are set to $I_1$ to $I_{12}$, respectively, a combination of current values obtained by (Formula 1) is obtained with respect to a reference current $A_N$.

$$I_i = A_N \cdot \cos(N(i-1)\pi/6)$$ [Formula 1]

(Formula 1) shows a current distribution in which a single multi-pole field is excited. On the other hand, a plurality of different multi-pole fields can be superimposed, and in this case, the current lines 101 to 112 are connected to different power supplies.

In the winding lens having no magnetic core in the related art, since directions of currents are reversed between the main line portion and the return line portion, the multi-pole field caused by the return line portion has an effect of weakening the multi-pole field caused by the main line portion. In contrast, in the winding lens of the present embodiment, the magnetic core 150 is arranged between the main line portion 121 and the return line portion 124, so that the magnetic core serves as a magnetic shield, and the return line portion does not influence the multi-pole field caused by the main line portion.

In a case of the multi-pole lens of the present embodiment, an excited magnetic field strength is hardly influenced by positional accuracy of the main line portion of the current line arranged in the groove of the magnetic core. In the winding aberration corrector without using the magnetic core in the related art, high accuracy is required for an arrangement position of the current line in order to generate a desired magnetic field. In contrast, in the winding aberration corrector of the present embodiment, when the center position of the groove of the magnetic core is manufactured with high accuracy in a circumferential direction and a radial direction, a deviation of the arrangement position of the current line in the groove has almost no influence on the magnetic field strength generated by the multi-pole lens, which is a very advantageous feature when actually manufacturing the multi-pole lens and constructing the aberration corrector.

With reference to FIGS. 3 and 4, the multi-pole lens will be described in which electrodes that excite an electric field by superimposing magnetic fields excited by the current lines are arranged. FIG. 3 is a cross-sectional view of the multi-pole lens. The cross-sectional view in FIG. 3 is a cross-sectional view in a plane including the optical axis 100 (central axis 150a). FIG. 4 shows cross-sectional views 391, 392, and 393 taken along lines A-A, B-B, and C-C shown in FIG. 3. That is, the cross-sectional views in FIG. 4 are cross-sectional views in the plane perpendicular to the optical axis 100 (central axis 150a).

Electrodes 301 to 312 that excite the electric field each have a wire shape, and a predetermined voltage is applied to each of the electrodes 301 to 312 to generate a desired electric field. Here, a structure of a vacuum container 350 in which the winding aberration corrector is arranged is maintained at a reference potential (GND). Therefore, the electrodes 301 to 312 are insulated from surrounding structures and positions thereof are fixed by electrode fixing portions 331 to 342, respectively. For example, the electrode fixing portion is configured as an insulating member whose surface is formed with a groove for fixing the electrode. In this example, a region through which the optical axis 100 passes is maintained in a vacuum state, and the electrode fixing portions 331 to 342 are provided in a vacuum partition wall 351 for setting a region in which the magnetic core 150 is arranged to, for example, atmospheric pressure. For example, the electrode 301 is fixed by a first electrode fixing portion 331a provided on an upper side (electron source side) and a second electrode fixing portion 331b provided on a lower side (sample side). In this example, the electrode fixing portions 331 to 342 are provided for respective electrodes, but for example, a single insulating member may be separately provided in the vacuum partition wall 351 located above and below the magnetic core 150, and the groove for arranging the electrode may be provided in the insulating member to fix the position of the electrode. In addition, the vacuum partition wall 351 in which the electrode fixing portion is provided is an example, and may be a structure in another vacuum container.

For aberration correction, the electrodes 301 to 312 are required to have high positional accuracy. Specifically, a distance ε between the electrode (a portion parallel to the optical axis 100) and the optical axis 100 (the central axis 150a) and an angle θ between adjacent electrodes as viewed from the optical axis 100 (the central axis 150a) need to be equal to each other. In this example, twelve electrodes are provided and the number of the electrodes is equal to the number of the grooves of the magnetic core 150, but the number of the electrodes may not be equal to the number of the grooves (or the number of the current lines). The angle between adjacent electrodes is an angle (360°/j) obtained by dividing the optical axis 100 (central axis 150a of the magnetic core 150) as a rotation axis by the number j of the electrodes, where j is the number of the electrodes.

In this example, the number of the electrodes is equal to the number of the grooves of the magnetic core, and the electrodes are arranged so as to correspond to the grooves of the magnetic core. That is, on a plane formed by centers of the grooves facing each other across the central axis 150a of the magnetic core, a portion of one electrode parallel to the central axis of the magnetic core and a portion of another electrode parallel to the central axis of the magnetic core are arranged symmetrically with respect to the central axis of the magnetic core. Specifically, the electrode 301 and the electrode 307 are arranged so as to be symmetrical with respect to the optical axis 100 (central axis 150a) on the plane formed by the central position 151a of the groove 151 and the central position 157a of the groove 157, the electrode 302 and the electrode 308 are arranged so as to be symmetrical with respect to the optical axis 100 (central axis 150a) on the plane formed by the central position 152a of the groove 152 and the central position 158a of the groove 158, the electrode 303 and the electrode 309 are arranged so as to be symmetrical with respect to the optical axis 100 (central axis 150a) on the plane formed by the central position 153a of the groove 153 and the central position 159a of the groove 159, the electrode 304 and the electrode 310 are arranged so as to be symmetrical with respect to the optical axis 100 (central axis 150a) on the plane formed by the central position 154a of the groove 154 and the central position 160a of the groove 160, the electrode 305 and the electrode 311 are arranged so as to be symmetrical with respect to the optical axis 100 (central axis 150a) on the plane formed by the central position 155a of the groove 155 and the central position 161a of the groove 161, and the electrode 306 and the electrode 312 are arranged so as to be symmetrical with respect to the optical axis 100 (central axis 150a) on the plane formed by the central position 156a of the groove 156 and the central position 162a of the groove 162.

Since the electric field excited by the electrodes 301 to 312 depends on the magnetic field excited by the multi-pole lens, the magnitude of the voltage applied to the electrodes 301 to 312 depends on the magnitude of the current flowing through the current lines 101 to 112 constituting the multi-pole lens. Therefore, as in the present embodiment, by making the number of the electrodes equal to the number of the grooves of the magnetic core and arranging the electrodes corresponding to the grooves in the magnetic core, it is possible to facilitate control of the winding aberration corrector. However, even when the number and the arrangement are different, the winding aberration corrector can be controlled by controlling the voltage applied to the electrodes or the current flowing through the current lines so as to interpolate a positional deviation between a generation position of the magnetic field and a generation position of the electric field.

In the present embodiment, a first shield 320 is provided above the magnetic core, and a second shield 321 is provided below the magnetic core. The shields 320 and 321 are conductive cylindrical members provided so as to surround the optical axis 100 (central axis 150a), and are arranged such that a central axis of the shield coincides with the optical axis 100 (central axis 150a). Potentials of the shields 320 and 321 are set to the reference potential. For example, by fixing the shields 320 and 321 to a structure of the vacuum container 350, which is the reference potential, the reference potential can be applied together with the positioning of the shields 320 and 321.

One of the roles of the shields 320 and 321 is to make these insulating members invisible from an electron beam since the insulating members (electrode fixing portions 331 to 342) are arranged near the optical axis 100. By arranging the shields 320 and 321 set to the reference potential between the optical axis 100 and the insulating members, the electron beam is not adversely influenced even when the insulating members are charged.

Another role of the shields 320 and 321 is to align a region where the magnetic field caused by the current lines acts and a region where the electric field caused by the electrodes acts. Therefore, it is desirable that a lower surface of the first shield 320 is at the same height as an upper surface of the magnetic core 150 or at a position lower than the upper surface, and similarly, it is desirable that an upper surface of the second shield 321 is at the same height as a lower surface of the magnetic core 150 or at a position higher than the lower surface. That is, it is desirable that the shield is arranged such that an end portion thereof coincides with an end portion of the magnetic core or faces the inner wall of the magnetic core. In this case, the region where the electric field acts and the region where the magnetic field acts are equal to each other, and the control of the winding aberration corrector can be facilitated. On the other hand, when the lower surface of the first shield 320 is at a position higher than the upper surface of the magnetic core 150 and/or the upper surface of the second shield 321 is at a position lower than the lower surface of the magnetic core 150, the region where the electric field acts and the region where the magnetic field acts are different from each other, and it is necessary to control to offset a difference in the regions of action.

The magnetic core used in the multi-pole lens of the present embodiment is not limited to the shape described above, and various modifications are possible. For example, the shape of the groove provided in the magnetic core can be determined in consideration of ease of winding. As shown in FIG. 5, a non-magnetic spacer 400 may be provided in the Z direction with respect to the magnetic core 150. By arranging the connection portion of the current lines on the non-magnetic spacer 400, a strength of a hexapole field excited by the connection portion can be reduced, and accuracy required for the position in the Z direction can be relaxed. FIG. 5 shows an example in which the non-magnetic spacer is provided on the upper surface of the magnetic core 150, but the non-magnetic spacer may be provided on both the upper and lower surfaces.

Further, instead of providing the grooves reaching the upper and lower surfaces of the magnetic core, a slit may be provided as shown in FIG. 6. A slit 501 is thinner than the other portions of a magnetic core 550, and through holes 502 and 503 penetrating an inner wall and an outer wall of the magnetic core 550 are provided at an upper end and a lower end of the slit 501. The current lines are arranged in the slit 501 through the through holes 502 and 503. In this structure, an influence of the positional deviation of the connection portion of the current lines can be eliminated, and an ideal multi-pole field caused by the winding lens can be excited. Similar effects can be obtained by using a magnetic core with upper and lower lids in which cylindrical magnetic lids having the same inner and outer diameters are arranged above and below the magnetic core with respect to the magnetic core shown in FIG. 1A.

FIG. 7 shows a configuration example of an electron beam apparatus incorporating the winding aberration corrector described above. The electron beam (not shown) emitted from an electron gun 701 is shaped into a parallel beam by a condenser lens 702, passes through a winding aberration corrector 703, is subjected to a convergence action by a condenser lens 704, and is converged on a sample 707 by an objective lens 706. At this time, a converged spot is subjected to a deflection action by a scanning coil 705 on the way and the sample 707 is scanned. The inside of a vacuum container 740 is made into a vacuum state, and the electron beam travels from the electron gun 701 to the sample 707 while the vacuum state is maintained. The winding aberration corrector 703 corrects an axial chromatic aberration and a spherical aberration. The winding aberration corrector 703 is connected to a power supply 711, and a multi-pole field of an electric field or a magnetic field is excited in the winding aberration corrector 703 by a voltage and a current output from the power supply 711. The power supply 711 is further connected to a computer 720 that controls the entire system. An output value from the power supply 711 to the winding aberration corrector 703 is changed in response to an instruction from the computer 720.

FIGS. 8A and 8B are electron optical schematic diagrams each showing a trajectory of an electron beam 750 passing through the winding aberration corrector. The trajectory of the electron beam 750 passing through the winding aberration corrector 703 changes depending on a direction. FIG. 8A shows a trajectory (x trajectory) viewed from a y direction (direction orthogonal to a paper surface in FIG. 7), and FIG. 8B shows a trajectory (y trajectory) viewed from an x direction (horizontal direction of the paper surface in FIG. 7). The winding aberration corrector 703 includes four stages of multi-pole lenses 771 to 774. The trajectory of the electron beam 750 is separated into the x trajectory and the y trajectory by a quadrupole field excited by the multi-pole lens 771, is then converged at a position of the multi-pole lens 772 in the x direction and converged at a position of the multi-pole lens 773 in the y direction, and passes through the multi-pole lens 774, and then the quadrupole field is excited in each of the multi-pole lenses 771 to 774 such that the x trajectory and the y trajectory become a symmetrical trajectory (parallel trajectory) again. In order to form such a trajectory, it is necessary to excite either a magnetic field or an electric field in the multi-pole lens 771 and the multi-pole lens 774, and to excite both a magnetic field and an electric field in the multi-pole lens 772 and the multi-pole lens 773. By using the winding aberration corrector of the present embodiment, it is possible to correct the chromatic aberration and the spherical aberration.

The invention is not limited to the above embodiment, and includes various modifications. For example, the above-described embodiment has been described for easy understanding of the invention, and the invention is not necessarily limited to those including all configurations described above. A part of configurations of one embodiment can be replaced with configurations of another embodiment, and configurations of one embodiment can be added to configurations of another embodiment. A part of the configuration of each embodiment may be added, deleted, or replaced with another configuration. For example, in the embodiment, an aspect in which the current line generating the magnetic field in the multi-pole lens is arranged in the groove provided on the inner wall of the magnetic core is described, and the plurality of current lines may be arranged axisymmetrically with respect to the central axis of the magnetic core along the inner wall of the magnetic core without providing the groove.

REFERENCE SIGN LIST 100 optical axis
101 to 112 current line
121 main line portion
122, 123 connection portion
124 return line portion
150, 550 magnetic core
151 to 162 groove
301 to 312 electrode
320 first shield
321 second shield
331 to 342 electrode fixing portion
350 vacuum container
351 vacuum partition wall
391, 392, 393 cross-sectional view
400 non-magnetic spacer
501 slit
502, 503 through hole
701 electron gun
702, 704 condenser lens
703 winding aberration corrector
705 scanning coil
706 objective lens
707 sample
711 power supply
720 computer
740 vacuum container
750 electron beam
771 to 774 multi-pole lens

The invention claimed is:
1. A charged particle beam apparatus, comprising:
an electron gun that emits a primary electron beam;
an aberration corrector that includes a plurality of stages of multi-pole lenses to which the primary electron beam is incident;
an objective lens to which the primary electron beam passing through the aberration corrector is incident; and
a vacuum container that accommodates the electron gun, the aberration corrector, and the objective lens, wherein
the multi-pole lens includes a magnetic core, a plurality of current lines, a plurality of wire-shaped electrodes, an insulating electrode fixing portion for fixing the plurality of electrodes to a structure in the vacuum container, and a conductive shield set to a reference potential, which is provided between the electrode fixing portion and a central axis of the magnetic core, main line portions of the plurality of current lines are arranged axisymmetrically with respect to the central axis of the magnetic core along an inner wall of the magnetic core, and portions of the plurality of electrodes extending along the central axis of the magnetic core are arranged axisymmetrically with respect to the central axis of the magnetic core.

2. The charged particle beam apparatus according to claim 1, wherein the number of the plurality of current lines and the number of the plurality of electrodes are equal to each other.

3. The charged particle beam apparatus according to claim 1, wherein a plurality of grooves are provided in the inner wall of the magnetic core, centers of the plurality of grooves are arranged axisymmetrically with respect to the central axis of the magnetic core, and the main line portions of the plurality of current lines are respectively arranged in any of the plurality of grooves of the magnetic core.

4. The charged particle beam apparatus according to claim 3, wherein the plurality of electrodes include a first electrode and a second electrode, and on a plane formed by the centers of the grooves facing each other across the central axis of the magnetic core, a portion of the first electrode parallel to the central axis of the magnetic core and a portion of the second electrode parallel to the central axis of the magnetic core are arranged symmetrically with respect to the central axis of the magnetic core.

5. The charged particle beam apparatus according to claim 1, wherein the shield is a cylindrical member arranged such that a central axis of the shield coincides with the central axis of the magnetic core, and the shield is arranged such that an end portion of the shield coincides with an end portion of the magnetic core, or arranged such that the end portion of the shield faces the inner wall of the magnetic core.

6. The charged particle beam apparatus according to claim 3, wherein the current line includes a connection portion that introduces the main line portion from an outside of the magnetic core into the groove, or leads the main line portion from the groove to the outside of the magnetic core, and a non-magnetic spacer is arranged between the connection portion of the current line and the magnetic core.

7. The charged particle beam apparatus according to claim 3, wherein the current line includes a connection portion that introduces the main line portion from an outside of the magnetic core into the groove, or leads the main line portion from the groove to the outside of the magnetic core, the multi-pole lens includes opposed magnetic lids provided in a longitudinal direction of the grooves of the magnetic core, and the connection portion of the current line is arranged in a through hole provided between the magnetic core and the magnetic lid.

8. The charged particle beam apparatus according to claim 1, wherein the aberration corrector includes four stages of the multi-pole lenses, and either a magnetic field or an electric field is excited in the multi-pole lenses of the first and fourth stages, and a magnetic field and an electric field are excited in the multi-pole lenses of the second and third stages.

* * * * *